(12) United States Patent
Bhagat et al.

(10) Patent No.: US 12,171,086 B2
(45) Date of Patent: Dec. 17, 2024

(54) THERMAL MANAGEMENT DEVICE FOR CIRCUIT BREAKERS

(71) Applicant: EATON INTELLIGENT POWER LIMITED, Dublin (IE)

(72) Inventors: Ankit Bhagat, Pune (IN); Sarang Sarode, Pune (IN); Avadhoot Kittur, Pune (IN); Niloy Khatua, Pune (IN); Robert Michael Slepian, Murrysville, PA (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 184 days.

(21) Appl. No.: 18/083,957

(22) Filed: Dec. 19, 2022

(65) Prior Publication Data

US 2024/0206123 A1 Jun. 20, 2024

(51) Int. Cl.
*H05K 7/20* (2006.01)
*H02H 3/08* (2006.01)

(52) U.S. Cl.
CPC ........... *H05K 7/20381* (2013.01); *H02H 3/08* (2013.01); *H05K 7/20309* (2013.01); *H05K 7/20318* (2013.01); *H05K 7/20336* (2013.01); *H05K 7/20409* (2013.01)

(58) Field of Classification Search
None
See application file for complete search history.

(56) References Cited

U.S. PATENT DOCUMENTS

| 4,005,297 A | 1/1977 | Cleaveland | |
|---|---|---|---|
| 7,336,477 B2 * | 2/2008 | Weister | H01H 9/52 174/16.3 |
| 7,841,385 B2 * | 11/2010 | Campbell | H05K 7/20218 165/80.4 |

(Continued)

FOREIGN PATENT DOCUMENTS

| CN | 114 446 721 A | 5/2022 |
|---|---|---|
| DE | 39 41 388 A1 | 6/1991 |

(Continued)

OTHER PUBLICATIONS

European Patent Office "International Search Report and Written Opinion" for corresponding International (PCT) Appl. No. PCT/EP2023/025527, dated Apr. 23, 2024, 14 pp.

*Primary Examiner* — Xanthia C Relford

(74) *Attorney, Agent, or Firm* — Eckert Seamans Cherin & Mellott, LLC

(57) ABSTRACT

A thermal management device for a circuit breaker includes: a heat pipe having an evaporator section, an adiabatic section and a condenser section; a busbar having a first portion including at least a portion of the adiabatic section of the heat pipe; a conducting busbar having a first end, a second end opposite the first end and a groove disposed on a top surface of the conducting busbar, the first end disposed adjacent to primary contacts, the second end integrated in the first portion of the busbar, the groove extending from the first end to the second end and including the evaporator section and the at least a portion of the adiabatic section of the heat pipe embedded therein; and an array of fins inte- (Continued)

grated to the second portion of the busbar, the condenser section of the heat pipe extending through the array of fins.

20 Claims, 12 Drawing Sheets

(56) References Cited

U.S. PATENT DOCUMENTS

| | | | | |
|---|---|---|---|---|
| 10,337,713 | B2* | 7/2019 | Zojceski | B60Q 1/0094 |
| 10,369,863 | B2* | 8/2019 | Connell | F25B 43/006 |
| 10,405,460 | B2* | 9/2019 | Pal | H05K 7/20409 |
| 10,588,242 | B1* | 3/2020 | Zou | H05K 7/20254 |
| 11,211,538 | B1* | 12/2021 | Pikulski | H01L 33/648 |
| 2009/0241592 | A1* | 10/2009 | Stover | F04B 39/06 |
| | | | | 62/505 |
| 2017/0295672 | A1* | 10/2017 | Pal | B64D 41/00 |
| 2020/0203255 | A1* | 6/2020 | Tschida | H01H 9/52 |
| 2020/0305270 | A1* | 9/2020 | Kim | H05K 1/18 |
| 2020/0352054 | A1* | 11/2020 | Schmit | H05K 7/2039 |
| 2020/0395739 | A1* | 12/2020 | Santore | H02B 1/04 |
| 2023/0146112 | A1* | 5/2023 | Desai | H05K 7/20409 |
| | | | | 361/679.46 |

FOREIGN PATENT DOCUMENTS

| | | |
|---|---|---|
| EP | 2 256 767 A2 | 12/2010 |
| EP | 2 983 261 A1 | 2/2016 |

* cited by examiner

THERMAL MANAGEMENT DEVICE FOR CIRCUIT BREAKERS

FIELD OF THE INVENTION

The disclosed concept relates generally to a thermal management device for a circuit breaker, and in particular finned heat pipe embedded busbars for thermal management of circuit breakers.

BACKGROUND OF THE INVENTION

Circuit interrupters, such as for example and without limitation, circuit breakers, are typically used to protect electrical circuitry from damage due to an overcurrent condition, such as an overload condition, a short circuit, or another fault condition, such as an arc fault or a ground fault. High operating temperature at breaker contacts leads to reliability issue, lower life of breaker, melting of contacts, and/or thermal creep. Generally, the heat is dissipated by cooling by thermal conduction via conductors and thermal radiation and convection of the thermal energy to the ambient. For example, the conductors (e.g., a busbar) cool down a high temperature area by its thermal properties and conductivity. However, in cases where more heat is generated (e.g., for larger circuit breakers such as air circuit breaker, some molded case circuit breakers), thermal conduction by conductors may not be sufficient to cool down the high temperature area, and thus, a heat pipe is added (e.g., bolted) along the busbars in order to conduct the heat to a different place. In some examples, the heat pipes are integrated on or sandwiched inside a hollow busbar section or between two busbars. But such heat pipes do not integrate a heat sink and an array of fins that allow for fast dissipation of large quantities of heat to the ambient. Further, such heat pipe is typically added outside (e.g., at busbar adaptors of a circuit breaker) of the circuit breakers due to limited cooling capacity and space available within the circuit breakers. However, including the heat pipes as a separate piece external to the busbars and circuit breakers adds to the manufacturing costs. Additionally, adding the heat pipes outside of the circuit breakers does not effectively reduce temperature rises associated with, e.g., the stationary contact and resulting fast temperatures rises of the busbars disposed within the circuit breakers and in proximity to the primary contacts. Furthermore, since the current flows through the busbars via thermal contacts, damages to primary contacts and moving parts of the circuit breakers and the circuit breakers in general due to the fast temperature rises of the busbars may result.

There is considerable room for improvement in thermal management device for the circuit breakers.

There is a room for improvement of integrating a heat pipe to the busbars disposed within the circuit breakers to dissipate heat from the high temperature areas as well as the busbars to a heat sink promptly and effectively.

SUMMARY OF THE INVENTION

These needs, and others, are met by embodiments of the disclosed concept in which a thermal management device for a circuit breaker is provided. The thermal management device includes: a heat pipe having an evaporator section, an adiabatic section and a condenser section; a busbar having a first portion including at least a portion of the adiabatic section of the heat pipe; a conducting busbar having a first end, a second end opposite the first end and a groove disposed on a top surface of the conducting busbar, the first end disposed adjacent to primary contacts, the second end integrated in the first portion of the busbar, the groove extending from the first end to the second end and including the evaporator section and the at least a portion of the adiabatic section of the heat pipe embedded therein; and an array of fins integrated to the second portion of the busbar, the condenser section of the heat pipe extending through the array of fins, where heat generated by current is dissipated from a high temperature area associated at least with the primary contacts to the ambient via the heat pipe.

Another embodiment provides a circuit breaker structured to be coupled between a power source via a hot conductor and a load via a load conductor. The circuit breaker includes primary a primary stationary contact coupled to the hot conductor and a primary moving contact coupled to the load conductor, and an operating mechanism structured to cause the primary contacts to close during normal operation and open to interrupt current from flowing to the load during a high current event. The thermal management device includes: a heat pipe having an evaporator section, an adiabatic section and a condenser section; a busbar having a first portion including at least a portion of the adiabatic section of the heat pipe; a conducting busbar having a first end, a second end opposite the first end and a groove disposed on a top surface of the conducting busbar, the first end disposed adjacent to primary contacts, the second end integrated in the first portion of the busbar, the groove extending from the first end to the second end and including the evaporator section and the at least a portion of the adiabatic section of the heat pipe embedded therein; and an array of fins integrated to the second portion of the busbar, the condenser section of the heat pipe extending through the array of fins, where heat generated by current is dissipated from a high temperature area associated at least with the primary contacts to the ambient via the heat pipe.

Another embodiment provides a method of thermal management for a circuit breaker structured to be connected between a power source and a load. The method includes providing a thermal management device in a circuit breaker, the thermal management device comprising a heat pipe having a first section, a second section and a third section, a busbar including the second section of the heat pipe, a conducting busbar disposed in the busbar and including a groove structured to receive the first section of the heat pipe, and an array of fins coupled to the busbar and through which the third section of the heat pipe extends, the busbar further coupled to load terminals for one or more loads; and channeling current from a high temperature area of the circuit breaker to the plurality of fins via the thermal management device, and dissipating heat generated by the current via the heat pipe.

BRIEF DESCRIPTION OF THE DRAWINGS

A full understanding of the invention can be gained from the following description of the preferred embodiments when read in conjunction with the accompanying drawings in which.

DETAILED DESCRIPTION OF THE INVENTION

Figure 1:
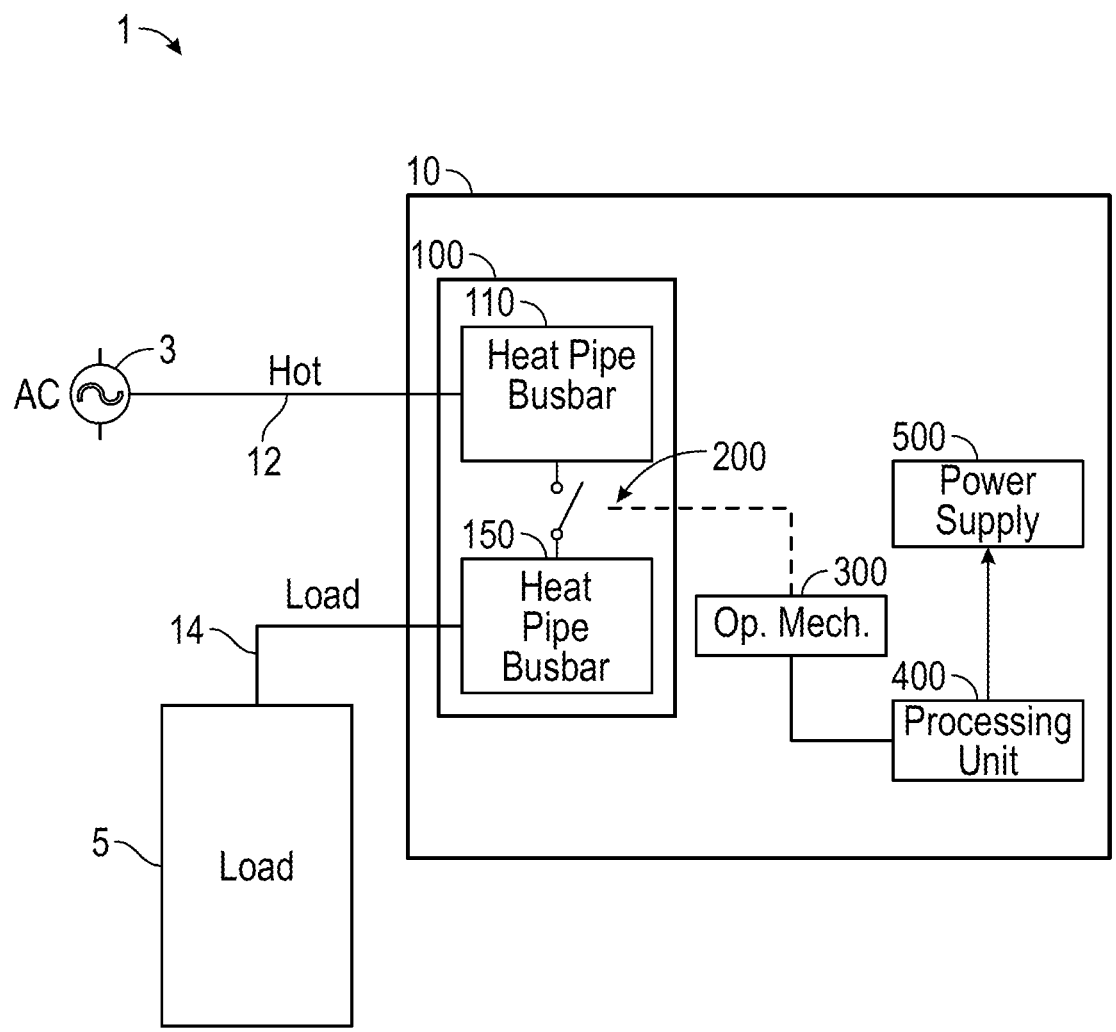
FIG. 1 is a schematic diagram of a power distribution system including a thermal management device in accordance with an example embodiment of the disclosed concept.

Directional phrases used herein, such as, for example, left, right, front, back, top, bottom and derivatives thereof, relate to the orientation of the elements shown in the drawings and are not limiting upon the claims unless expressly recited therein.

As employed herein, the statement that two or more parts are "coupled" together shall mean that the parts are joined together either directly or joined through one or more intermediate parts.

Example embodiments of the disclosed concept, which will be described in more detail herein, provide a thermal management apparatus, system and method for circuit breakers, and in particular, thermal management device, system or method of primary contacts for circuit breakers by using a compact heat pipe embedded on the surface of the electrically conducting busbars with integrated conducting busbars and fins. High operating temperature at breaker contacts leads to reliability issue, lower life of breaker, melting of contacts, and/or thermal creep. Generally, the heat is dissipated via conductors. In cases where more heat is generated (e.g., for larger circuit breakers such as air circuit breaker, large molded case circuit breakers, etc.), thermal conduction by conductors may not be sufficient to cool down the high temperature area, and thus, a heat pipe is added (e.g., bolted) along the busbars and conduct the heat to a different place. Such heat pipe is typically added outside of the circuit breakers due to limited cooling capacity and space available within the circuit breakers. However, including the heat pipe as a separate piece outside of the busbars and circuit breakers adds to the manufacturing costs. Additionally, adding the heat pipe outside of the circuit breakers does not effectively reduce temperature rises associated with, e.g., the stationary contact and resulting fast temperatures rises of the busbars disposed within the circuit breakers and in proximity to the primary contacts. Furthermore, since the current flows through the busbars via thermal contacts, damages to primary contacts and moving parts of the circuit breaker and the circuit breaker in general due to the fast temperature rises of the busbars may result.

By embedding a heat pipe within the current carrying components (e.g., a heat sink, the busbars, and the fins) according to the disclosed concept, the example embodiments of thermal management device does not rely on general conduction of the high current by having thermal contact with the busbars, but on enhanced thermal conduction using a heat pipe embedded within a groove(s) on surface(s) of the conducting busbar and busbars and running through an array of fins attached (e.g., molded) to the busbars and/or the conducting busbar. By embedding the heat pipe within the conducting busbar, the conducting busbar becomes more effective since the heat pipe expands transversely and laterally within the groove of the conducting busbar, and thus, spread the heat around the conducting busbar and the busbars more effectively. Further, by embedding the heat pipe within the conducting busbar, the heat is promptly transported from the primary contacts to the conducting busbar immediately upon the occurrence of high current (e.g., overload current). As a result, the thermal management device reduces the temperature of the moving and stationary contacts of the circuit breaker by almost 20° C. It further reduces the overall operating temperature of the circuit breakers. For example, it also reduces temperatures at the load conductors by almost 15° C., and temperatures at the load terminals (coupled to loads of an end user) by more than 10° C. Further, the quick transportation of the heat results in an increase of the life of the primary contacts as well as other moving parts (e.g., the moving arm, pull shaft, pivots, etc.) that otherwise would become damaged or unusable due in part to thermal creeping. It also reduces the possibility of welding of the contacts during short-circuit currents. Additionally, it increases current ampacity of a given cross section of a busbar by maintaining temperature limits within the standards. Moreover, it helps increasing the rated operating current of the circuit breaker by reducing the temperature of contacts, thereby allowing a smaller circuit breaker to be used at the increased rated operating current in a power distribution system having limited spaces.

FIG. 1 is a diagram of a power distribution system 1 in accordance with an example embodiment of the disclosed concept. The power distribution system 1 includes a circuit interrupter 10 (e.g., without limitation, a circuit breaker) electrically connected between a power source 3 (e.g., utility) via HOT conductors 12 and a load(s) 5 via LOAD conductors 14. The circuit breaker 10 is structured to trip open or switch open to interrupt current flowing to the load 5, for example, in the case of a fault condition (e.g., without limitation, an overcurrent condition) to protect the load 5, circuitry associated with the load 5, as well as the components within the circuit breaker 10. The circuit breaker 10 may be a single-phase circuit breaker or any other number of phases may be employed without departing from the scope of the disclosed concept.

Figure 2A:
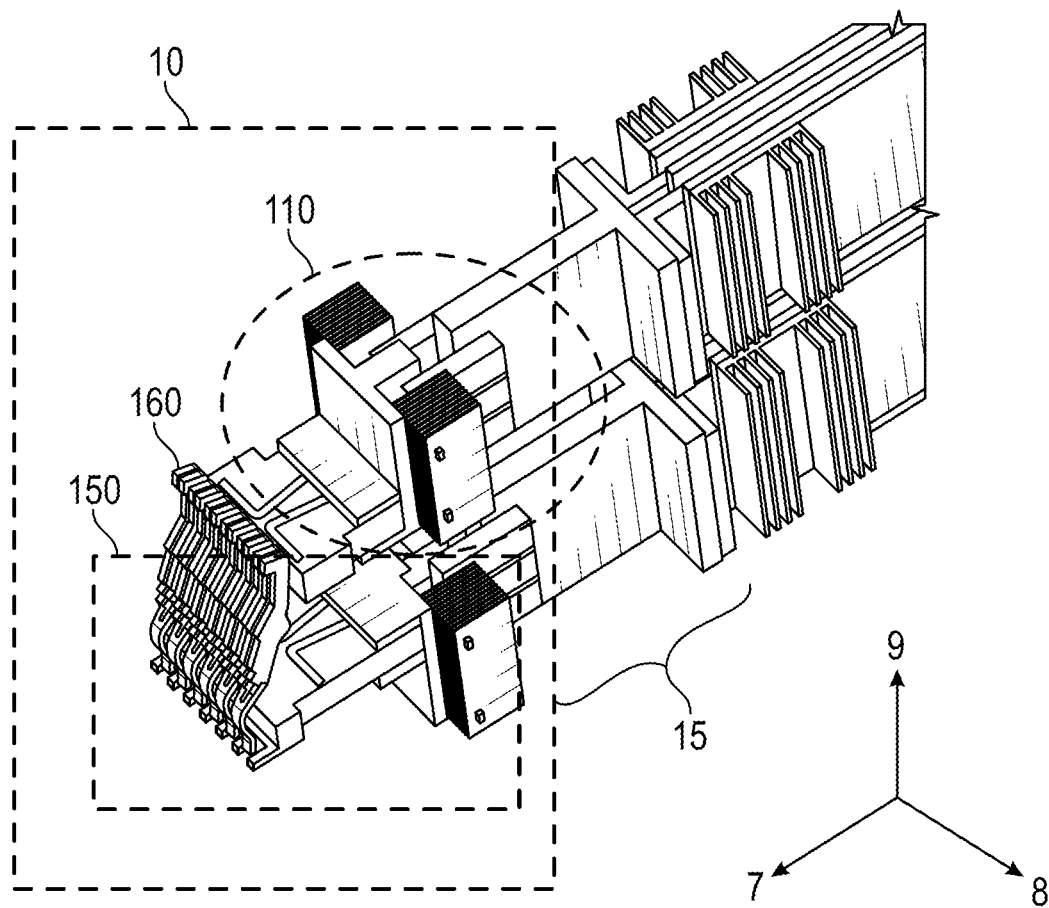
FIG. 2A is a top perspective view of a thermal management device coupled to load terminals in accordance with an example embodiment of the disclosed concept.

The circuit breaker 10 includes a thermal management device 100, contact fingers 160, primary contacts 200 (a primary stationary contact and a primary moving contact), an operating mechanism 300, a processing unit 400 and a power supply 500. An electronic trip unit (not shown) may be included to monitor for faults based on power flowing through the circuit breaker 10 and output a trip signal to the operating mechanism 300. For example, in a mechanical circuit interrupter, the separable contacts are designed to interrupt current flowing through the circuit interrupter and have associated components such as an arc chute to manage arcing as a result of circuit interruption. The contact fingers (moving arms) 160 are made of copper and brazed on a moving contact, which is made of different materials. The moving contact opens and closes when the fingers 160 open and close, thereby breaking and making the contact. In some example embodiments, the separable contacts 200 are closed with manual intervention by a user through, for example, a reset switch. In some example embodiments, the operating mechanism 300 is structured to close the primary separable contacts 200 in response to a close signal from the electronic trip unit. The processing unit 400 includes a control circuit (e.g., a microcontroller, a CPU, etc.) and, optionally, a memory. The power supply 500 supplies power to the processing unit 400 and other electrical components within the circuit breaker 10 (e.g., a current sensor, an electronic trip unit, etc.). As shown in FIG. 2A, the circuit breaker 10 is coupled to an electrical connection (e.g., load terminals, connectors) 15 that electrically connects loads 5 of the end user.

Figure 3A:
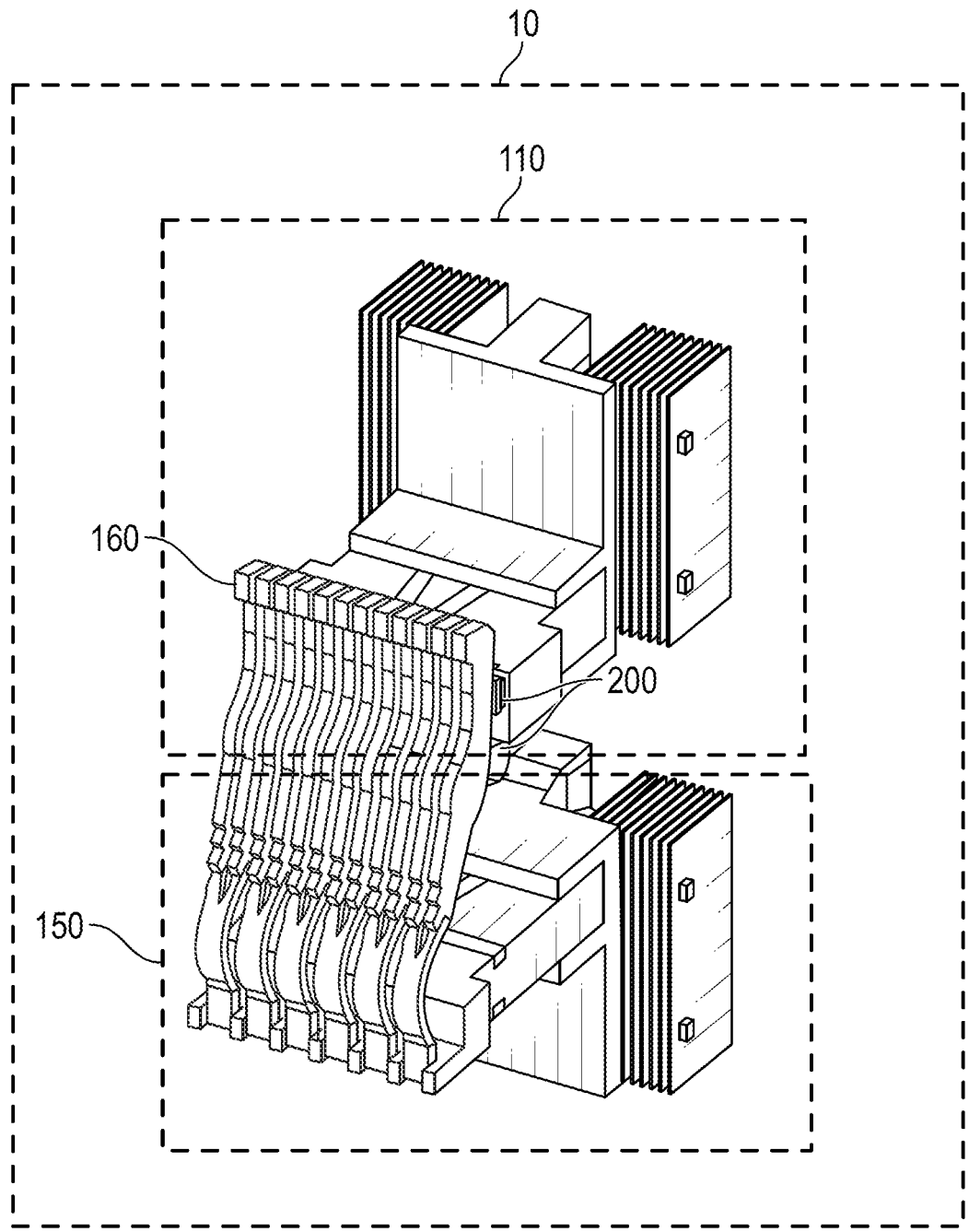
FIG. 3A is a top perspective view of a circuit breaker with a thermal management device in accordance with an example embodiment of the disclosed concept.
Figure 3B:
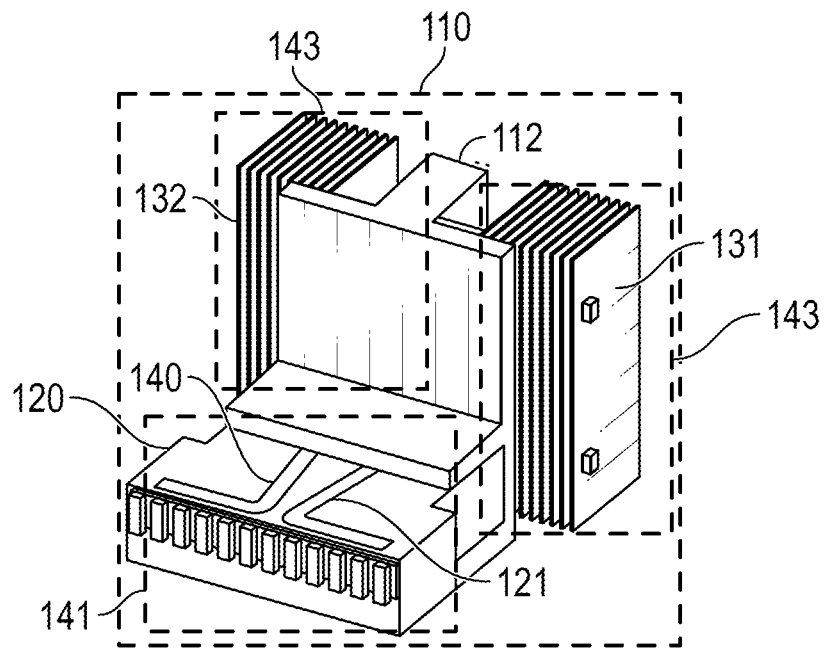
FIG. 3B is an enlarged view of finned heat pipe embedded line busbars for thermal management of the circuit breaker in accordance with an example embodiment of the disclosed concept.
Figure 3C:
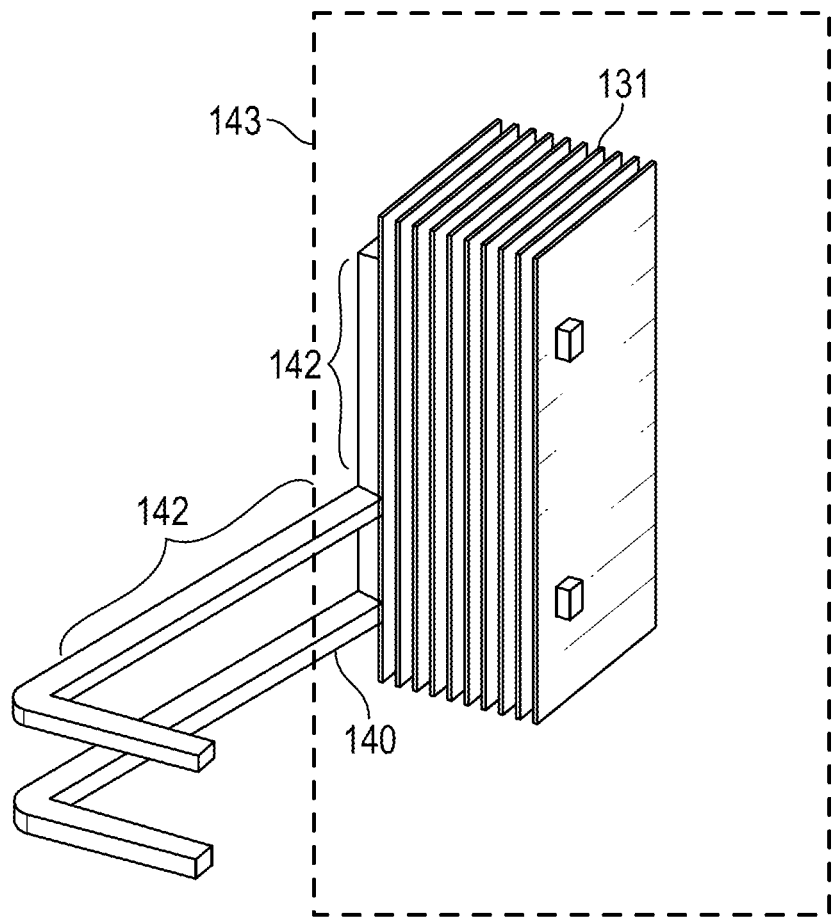
FIG. 3C is an enlarged view of a condenser section of the finned heat pipe embedded busbars for thermal management of the circuit breaker in accordance with an example embodiment of the disclosed concept.
Figure 3D:
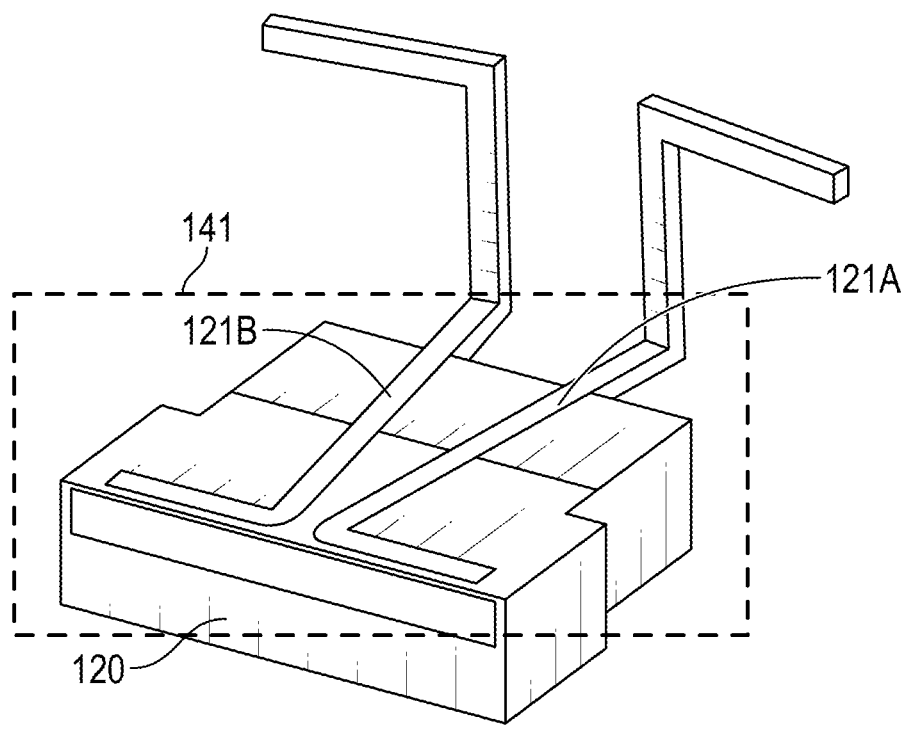
FIG. 3D is an enlarged view of an evaporator section of the finned heat pipe embedded busbars for thermal management of the circuit breaker in accordance with an example embodiment of the disclosed concept.
Figure 3E:
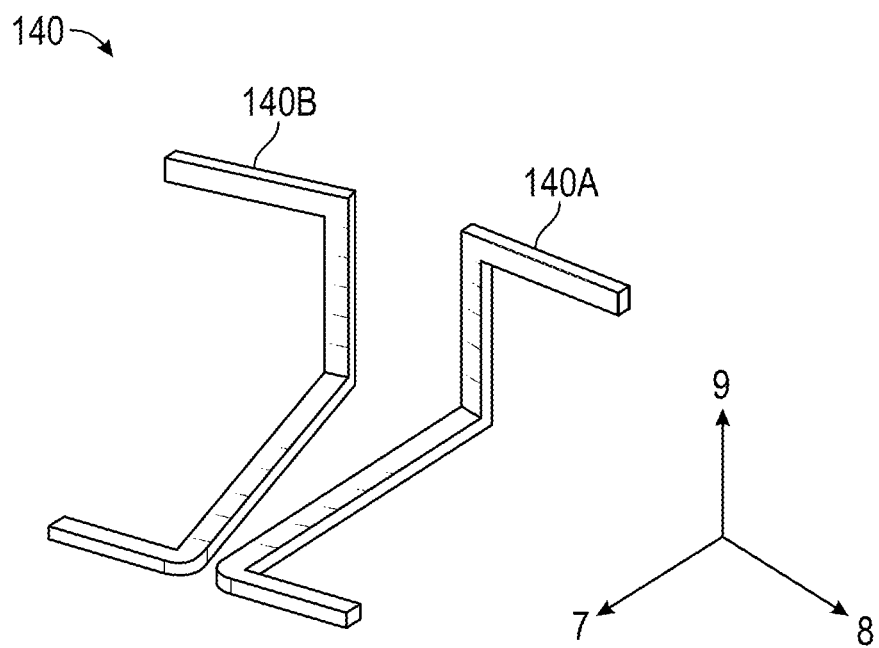
FIG. 3E is an enlarged view of a portion of a pair of heat pipes to be embedded in the busbars in accordance with an example embodiment of the disclosed concept.
Figure 4A:
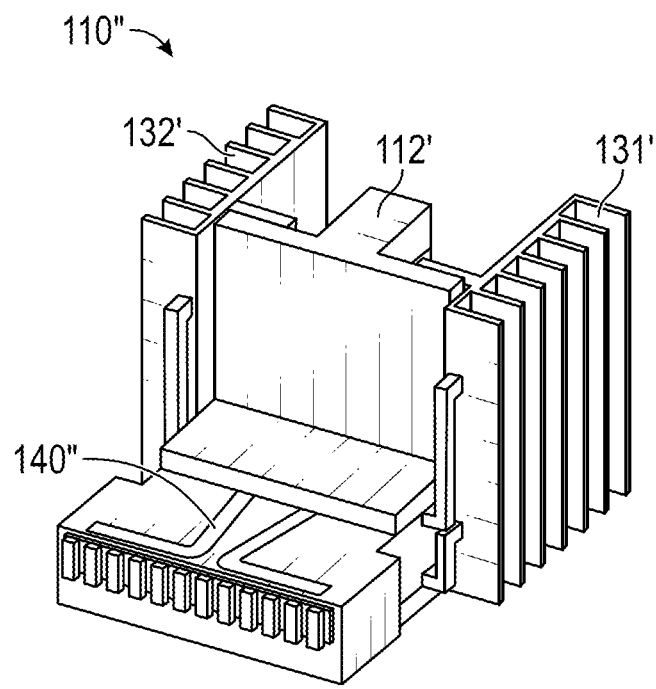
FIG. 4A is a top perspective of finned heat pipe embedded line busbars for thermal management of the circuit breaker in accordance with an example embodiment of the disclosed concept.
Figure 4B:
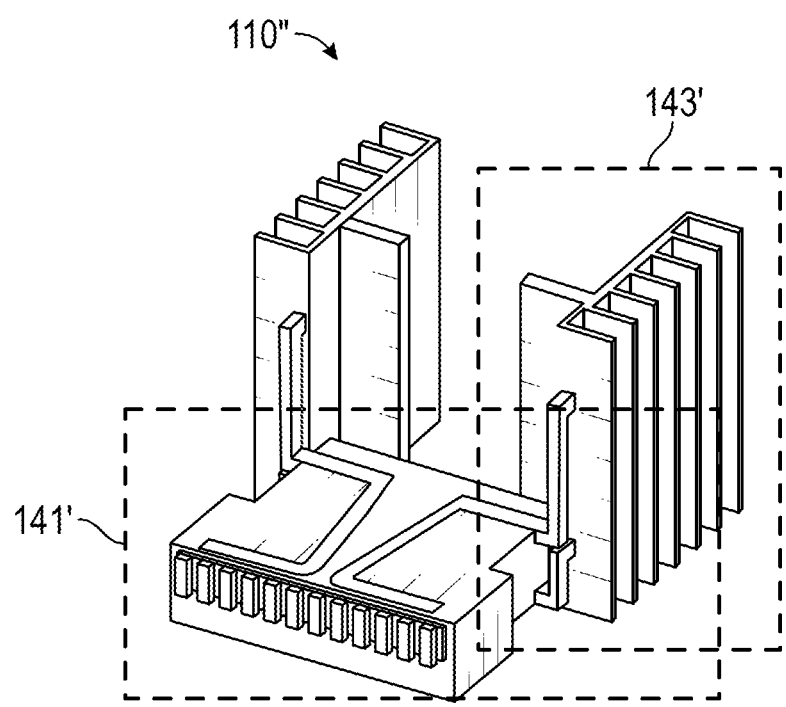
FIG. 4B is a top perspective view of finned heat pipe prior to being embedded in the line busbars in accordance with an example embodiment of the disclosed concept.
Figure 4C:
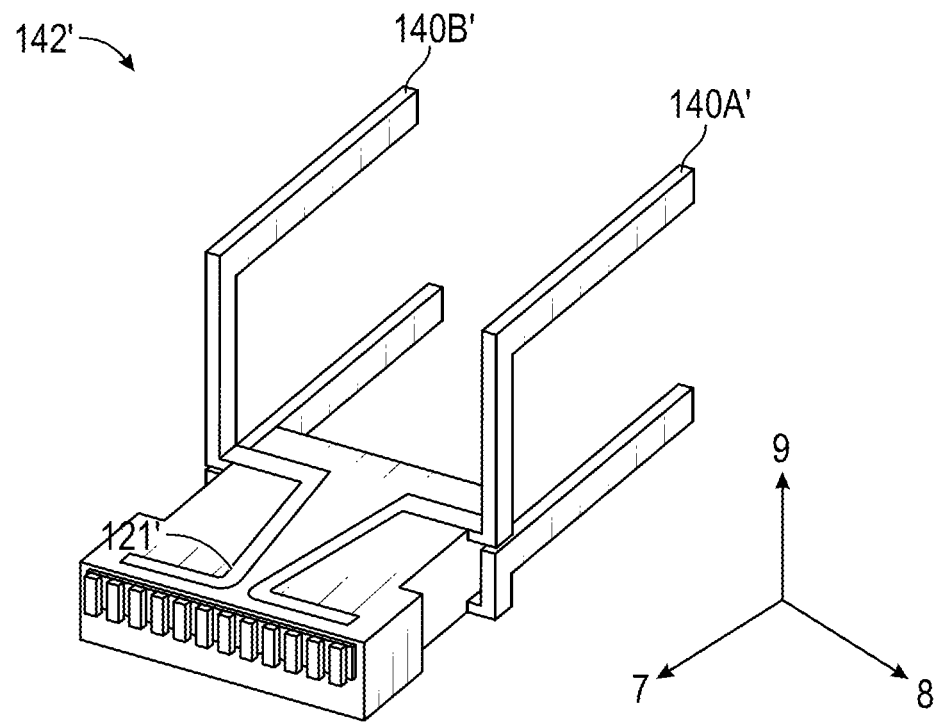
FIG. 4C is a top perspective view of an evaporator section of a heat pipe embedded within a conducting busbar and an adiabatic section of a heat pipe in accordance with an example embodiment of the disclosed concept.
Figure 4D:
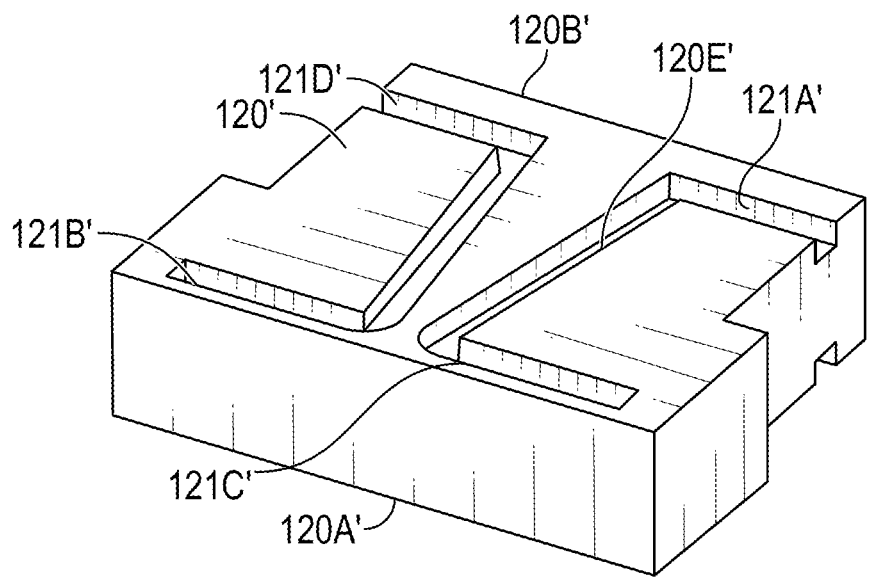
FIG. 4D is a top perspective enlarged view of a conducting busbar including a groove in accordance with an example embodiment of the disclosed concept.
Figure 4E:
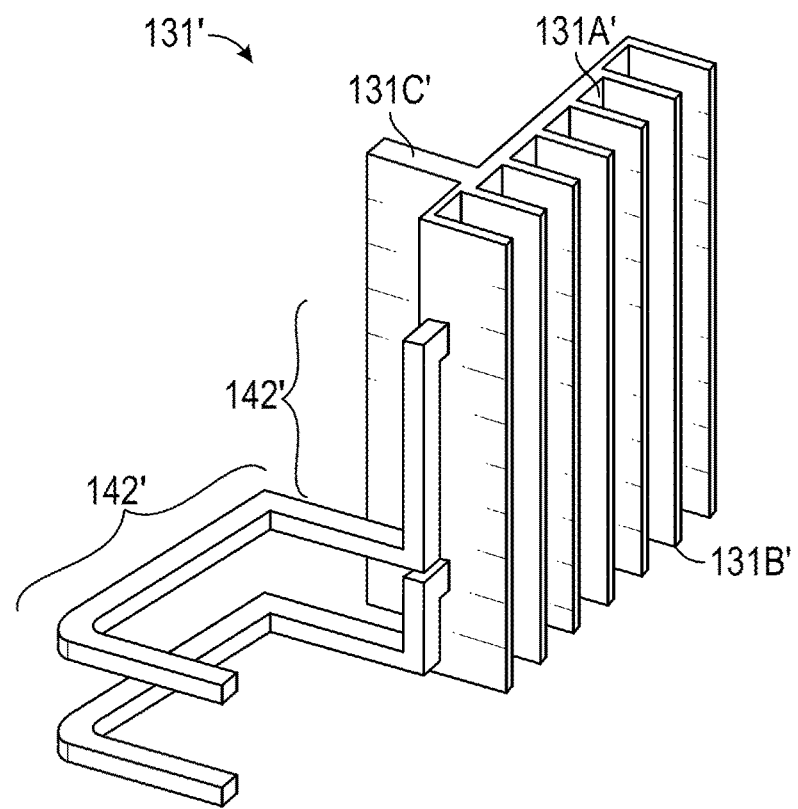
FIG. 4E is a top perspective enlarged view of a portion of an adiabatic section of the heat pipe and a condenser section of the heat pipe integrated in an array of fins in accordance with an example embodiment of the disclosed concept.
Figure 4F:
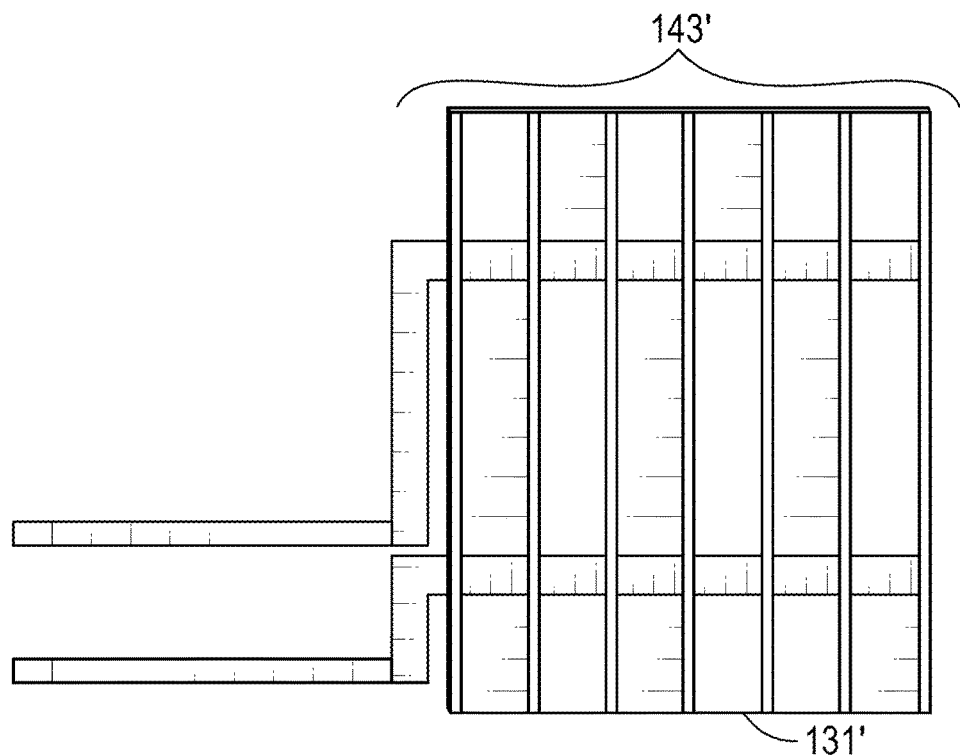
FIG. 4F is a cross-sectional view of a plurality fins integrating a condenser section of the heat pipe in accordance with an example embodiment of the disclosed concept.
Figure 4G:
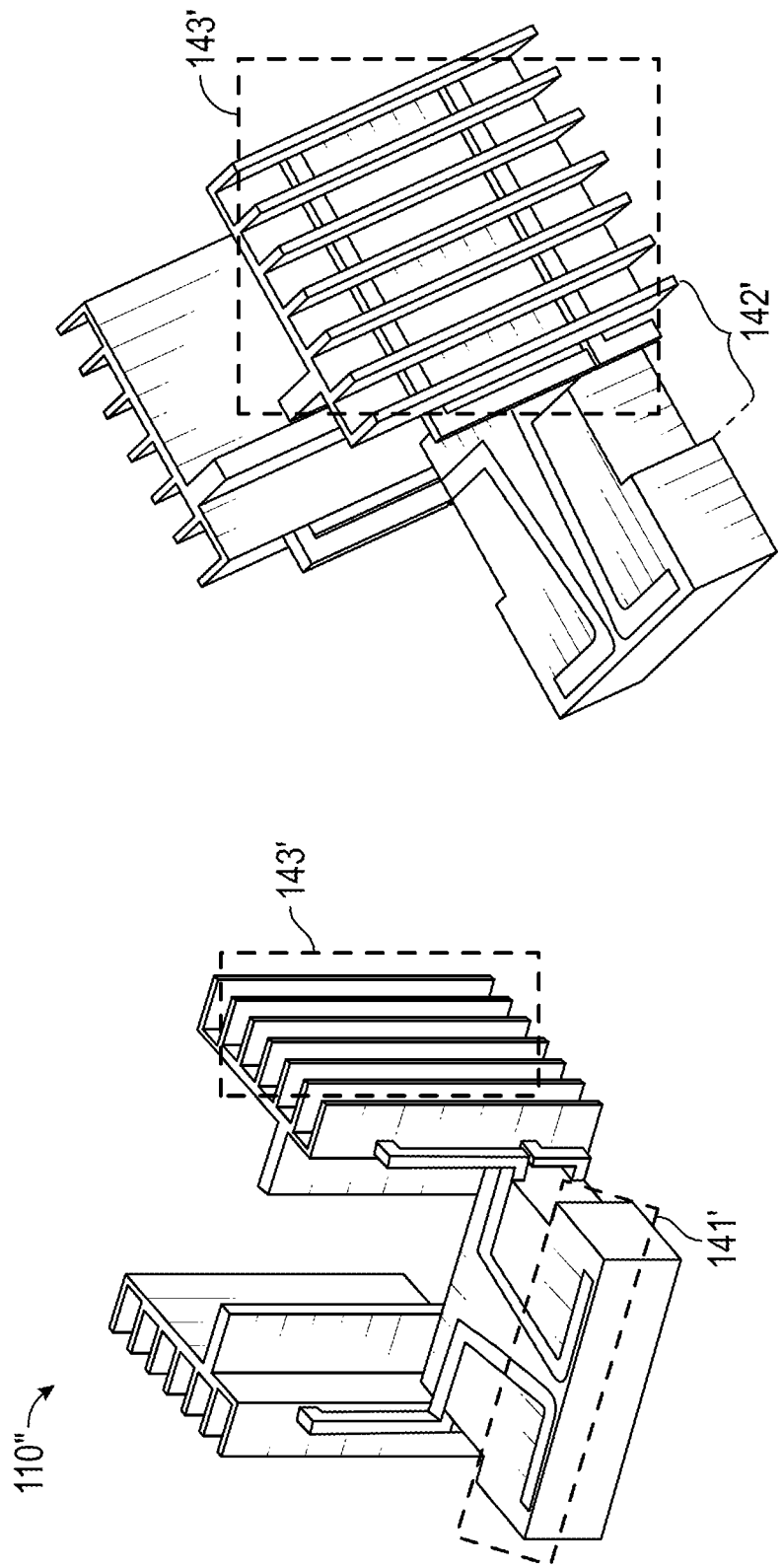
FIG. 4G is a top perspective view of the finned heat pipe of FIG. 4B illustrating an evaporator section and a condenser section of the heat pipe in accordance with an example embodiment of the disclosed concept.

As shown in FIGS. 1, 2A and 3A, the thermal management device 100 includes a finned heat pipe embedded line busbars 110 electrically coupled to the stationary contact at the line side and a finned heat pipe embedded load busbars 150 coupled to a primary moving contact at the load side. The finned heat pipe embedded busbars 110, 150 include a conducting busbar disposed within the busbars, a heat pipe embedded within the conducting busbar and an array of fins. In some examples, the thermal management device may include only one of the finned heat pipe embedded busbars.

FIGS. 2A, 2C and 3A-F illustrate an example embodiment of the thermal management device 100 according to the disclosed concept. While these figures mainly show the finned heat pipe embedded line busbars 110, it will be understood that the finned heat pipe embedded load busbars 150 includes similar structure and components as those of the finned heat pipe embedded line busbars 110.

As shown in FIGS. 2A, 2C, 3A and 3B, the finned heat pipe embedded line busbars 110 includes line busbars 112, a conducting busbar 120, an array of fins 130 and a first heat pipe 140. The heat pipe 140 includes a first member 140A and a second member 140B. The first member 140A expands one half of the top surface area of the conducting busbar 120, and the second member 140B expands one half of the top surface area of the conducting busbar 120. The first heat pipe 140 (i.e., each member 140A,140B) includes an evaporator section 141, an adiabatic section 142, and a condenser section 143. The line busbars 112 includes a first portion 112A and a second portion 112B, the first portion 112A including at least a portion of the adiabatic section 142 of the heat pipe 140. The conducting busbar 120 has a first end 120A and a second end 120B opposite the first end 120A, the first end 120A electrically coupled (e.g., attached) to the primary stationary contact or disposed adjacent to the primary contacts 200 (or a contact area). The first end 120A may be surrounded or enveloped by the first portion 112A of the line busbars 112. The conducting busbar 120 also includes a groove 121 disposed on the top surface of the conducting busbar 120. The groove 121 includes a first groove member 121A and a second groove member 121B, and extends from the first end 120A to the second end 120B. It extends within the top surface transversely (in direction parallel to the axis 8) and laterally (in direction parallel to the axis 7), thereby covering as much surface areas of the conducting busbar 120. The evaporator section 141 and a part of the adiabatic section 142 of the first heat pipe 140 are embedded within the groove 121. That is, the evaporator section 141 and a part of the adiabatic section 142 of the first member 140A of the heat pipe 140 are embedded within the first groove member 121A, and the evaporator section 141 and a part of the adiabatic section 142 of the second member 140B of the first heat pipe 140 are embedded within the second groove member 121B. Remaining portion of the adiabatic section 142 may be embedded in a groove (not shown) within a surface of the second portion of the busbars 112. The groove of the second portion of the busbars 112 may extend longitudinally (in direction parallel to the axis 9). The array 130 of fins may include at least two arrays of fins, one array 131 attached to one edge of the busbars 112 and another array 131 attached to another edge opposite the one edge of the busbars 112. The condenser section 143 of the first member 140A of the first heat pipe 140 transits through the one array 131, and the condenser section 143 of the second member 140B of the first heat pipe 140 transits through the another array 132. The arrays 131,132 of fins may extend transversely (in direction of the axis 8) away from each other. The current flows from the primary contacts 200 to the conducting busbar 120, the busbars 112, and then the array 131,132 of fins. The heat from the current is dissipated from the contact area to the ambient via the first heat pipe 140.

The conducting busbar 120, the busbars 112, and the array 131, 132 of fins may be made of highly conductive materials such as copper or aluminum. The conducting busbar 120 may have a flat rectangular structure and have varying widths at various portions. The array 130 of fins is structured to increase the surface area for heat dissipation, and a number and size of the fins depend on the circuit breaker capacity and airflow therein. The heat pipe 140 may be a hollow tube including cooling liquid (e.g., without limitation, water) and a wick structure (e.g., without limitation, a woven mesh). The heat pipe 140 uses phase change (i.e., change of state such as liquid to gas, gas to liquid, solid to liquid, liquid to solid, solid to gas) as a medium to absorb heat at the evaporator section 141, transports the heat through the adiabatic region 142, and releases the heat at the condenser section 143. That is, as the current flows through the conducting busbar 120, at the evaporator section 141 the cooling liquid will boil, the heat is removed as it travels through the adiabatic region 142, and the vapor (gas) returns to the liquid at the condenser section 143. The wick returns the liquid back to the evaporator section 141. The phase change phenomenon helps to achieve the latent cooling of the circuit breaker 10 with very high heat transfer coefficient (e.g., without limitation, 20,000 W/m2K) and low temperature gradient throughout the adiabatic length 142.

The heat pipe 140 may also include a third heat pipe embedded in a third groove (not shown) on a bottom surface of the conducting busbar 120. That is, the evaporator section and at least a portion of the adiabatic section of the first member of the third heat pipe are embedded within a first groove member of the third groove on the bottom surface of the conducting busbar 120, and the evaporator section and at least a portion of the adiabatic section of the second member of the third heat pipe are embedded within the second groove member of the third groove. The condenser section of the first member of the third heat pipe transits through the one array of the at least two arrays 131,132 of fins and the condenser section of the second member of the third heat pipe transits through the another array of the at least two arrays 131,132 of fins. The condenser sections of the third heat pipe run in parallel and below the condenser sections of the first heat pipe 140. The addition of the third heat pipe further increases the surface area for dissipation, thereby further enhancing thermal conduction capability.

As stated previously, the finned heat pipe embedded load busbars 150 includes similar features and components as the finned heat pipe embedded line busbars 110. As such, while not shown in the figures, the finned heat pipe embedded load busbars 150 includes a second heat pipe having a first member and a second member, each member having an evaporator section, an adiabatic section and a condenser section. It also includes a second conducting busbar having a first end, a second end opposite the first end and a second groove on a top surface of the second conducting busbar, the first end disposed adjacent to a primary moving arm, the second end integrated in or attached to the first portion of the busbar. The second groove includes a first groove member and a second groove member that extend from the first end of the conducting busbar to the second end of the conducting busbar. The evaporator section and at least a portion of the first member of the second conducting busbar are embedded within the first groove member and the evaporator section and at least a portion of the adiabatic section of the second member of the second conducting busbar are embedded within the second groove member. The finned heat pipe embedded load busbars 150 further include at least two arrays of fins, one array attached to one edge of the second portion of the second busbars. The condenser section of the first member of the second heat pipe transits through the one array of fins, and the condenser section of the second member of the second heat pipe transits through the other array of fins. The heat generated by the current is dissipated from the high temperature area associated at least with the primary contacts to the ambient via the second heat pipe.

Another example embodiment of the finned heat pipe embedded line busbars 110" for thermal management of a circuit breaker is shown in FIGS. 4A-G. The finned heat pipe embedded line busbars 110" is similar to the finned heat pipe embedded line busbars 110 as illustrated in FIGS. 2A, 2C, and 3A-E, except that the heat pipe 140', the groove 121', and the plurality of fins 130' have different configurations to further enhance conduction, reduce manufacturing cost and labor, and allow for installation of the thermal management device in a variety of circuit breakers having different space availabilities. For example, the groove 121' includes a first groove member 121A' and a second groove member 121B', each groove member including a first part 121C' extending transversely along the first end 120A' of the conducting busbar 120', a second part 121D' extending transversely along the second end 120B' of the conducting busbar 120', and a third part 121E' extending laterally and connecting the first and second parts 121C', 121D'. Further, the arrays 131',132' of fins are configured differently than the arrays 131,132 of fins in FIGS. 2A, 2C and 3A-E. Each array 131',132' of fins include a vertical wall 131A' extending laterally (in direction of the axis 7), a plurality of fins 131B' extending transversely outwardly from the vertical wall 131A', and a connector fin 131C' extending transversely away from the plurality of fins 131B'. The connector fin 131C' is attached to respective edge of the busbars 112', and an edge of the conducting busbar 120' is attached to or integrated within respective bottom part of the connector fin 131C' and the vertical wall 131A'. Also, a portion of the adiabatic section 142' runs vertically along a surface of a fin closest to the respective edge of the conducting busbar 120'. The plurality of fins 131B' of one array 131' and the plurality of fins 131B' of another array 132' extend laterally in parallel to one another with the busbars 112" disposed therebetween. Thus, by adding the second part 121D' of the groove 121' and the arrays 131',132' that expand laterally further, this embodiment provides even more surface areas for dissipation than the embodiment as illustrated in FIGS. 2A, 2C and 3A-E, and allow for a variety of configurations for the heat pipe, conducting busbar and the array of fins within the circuit breaker, depending on space availability within the circuit breaker.

In FIGS. 2A, 2C-4G, the heat pipe 140 includes two members (140A and 140B, 140A' and 140B') and the groove includes two groove members (121A and 121B, 121A' and 121B'). The evaporator section 141 and at least a portion of the adiabatic section 142 of the first member 140A, 140A' and the second member 140B, 140B' are embedded within the first groove member 121A,121A' and the second groove member 121B, 121B', respectively. It is to be understood that the heat pipe 140 may include one member embedded within one groove. In such cases, the adiabatic section 142,142' may split into sections leading to respective condenser sections within respective array 131,131',132,132' of fins. Other configurations of the heat pipe, the conducting busbar, the busbars and the array(s) of fins may be adopted depending on the spaces within and breaker structure of the circuit breakers.

Figure 2B:
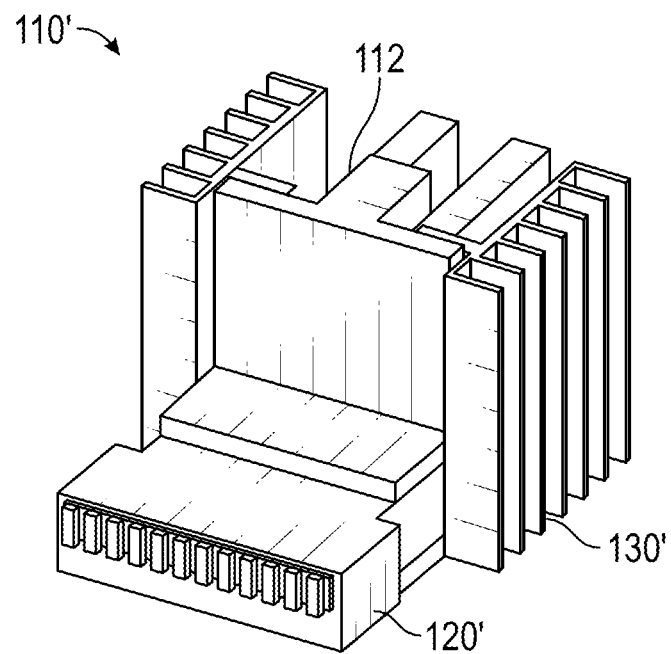
FIG. 2B is a top perspective view of a circuit breaker without a thermal management device including finned heat pipe embedded busbars for thermal management of the circuit breaker.
Figure 2C:
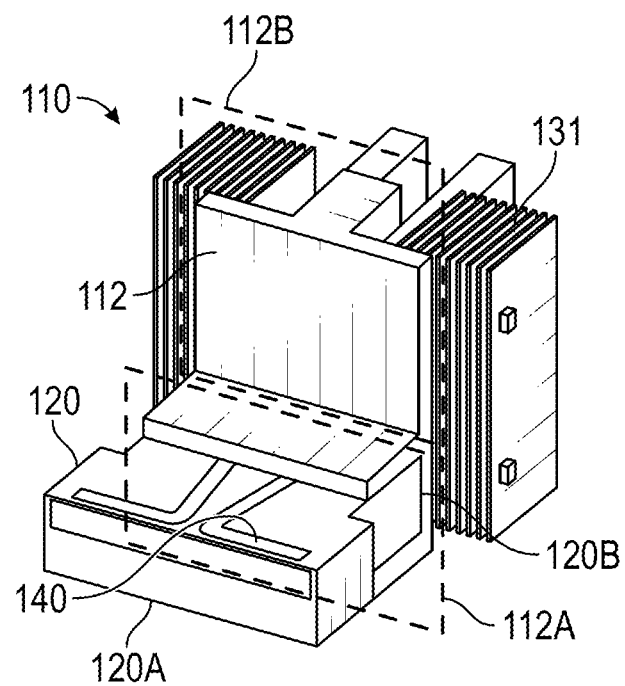
FIG. 2C is a top perspective view of a circuit breaker with a thermal management device in accordance with an example embodiment of the disclosed concept.

FIG. 2B illustrates a finned heat pipe line busbars 110' without the heat pipe 140 embedded on the surfaces of the conducting busbar 120', the busbars 112 and the array 130' of fins.

By embedding the heat pipe 140 within the conducting busbar 120 and the busbars 112, the thermal management device 100 according to the disclosed concept allows the conducting busbar 120 to transport heat more effectively and spread the heat around the busbars 112 more effectively as compared to the conventional thermal management device of the circuit breakers including a heat pipe or conducting busbar as a separate piece outside of the busbars and the circuit breakers. In addition, integrating the heat pipe 140 in the highly conductive fins 130 allows the heat pipe 140 to dissipate larger quantities of heat even more quickly to the ambient by providing more surface area for the dissipation of the heat as compared to the conventional thermal management devices which do not typically include the arrays of the fins. Further, the thermal management device 100 decreases the temperatures at the high temperature areas significantly. For example, it has been shown that the thermal management device 100 yielded, e.g., without limitation, 19° C. drop at the primary contacts 200, 14° C. drop at the load conductor, and 11° C. drop at the load terminals. As such, the heat pipe 140 increases overall heat transfer capacity of the electrically conducting busbars 112 using phase change phenomenon and dissipate heat through the conducting busbar 120 to air more effectively.

Figure 5:
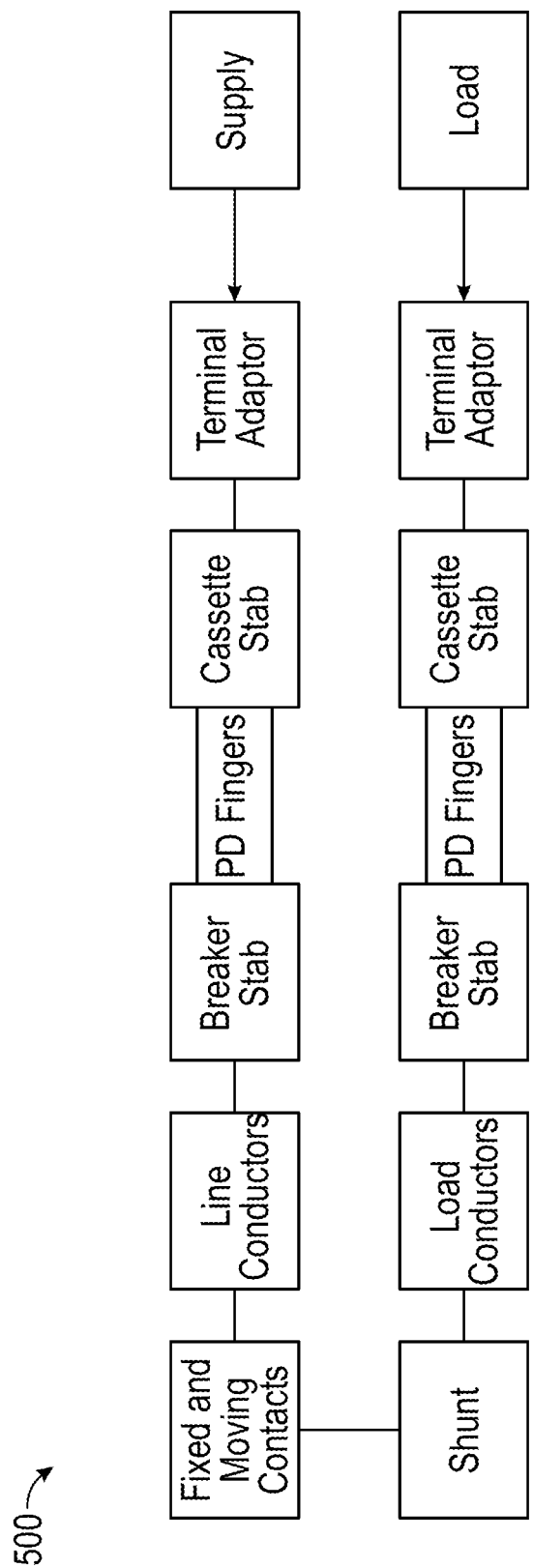
FIG. 5 is a block diagram of construction of a circuit breaker including a thermal management device in accordance with an example embodiment of the disclosed concept.

FIG. 5 is a block diagram 500 of constructing a circuit breaker having a thermal management device 100 according to an example embodiment of the disclosed concept. This circuit breaker construction may be used for installing a removable or withdrawable circuit breaker in a cassette within, e.g., a switch box. However, the construction may be used for plug-in installation or any other appropriate installation method within the confines of the standards. The circuit breaker includes a finned heat pipe embedded line busbars structured to be coupled to a power supply and a finned heat pipe embedded load busbars structured to be coupled to one or more loads. The circuit breaker is first coupled to a terminal adapter of a cassette and a cassette stab, which is coupled to contact fingers at one end. A breaker stab is coupled to the contact fingers and to line conductors, which are coupled to fixed and moving contacts. The primary contacts are coupled to a shunt, which is coupled to the load conductors. The load conductors are then coupled to a breaker stab, which is in turn coupled to the contact fingers at another end. The contact fingers are coupled to another cassette stab, which is in turn coupled to a terminal adaptor that is coupled to the load(s).

Figure 6:
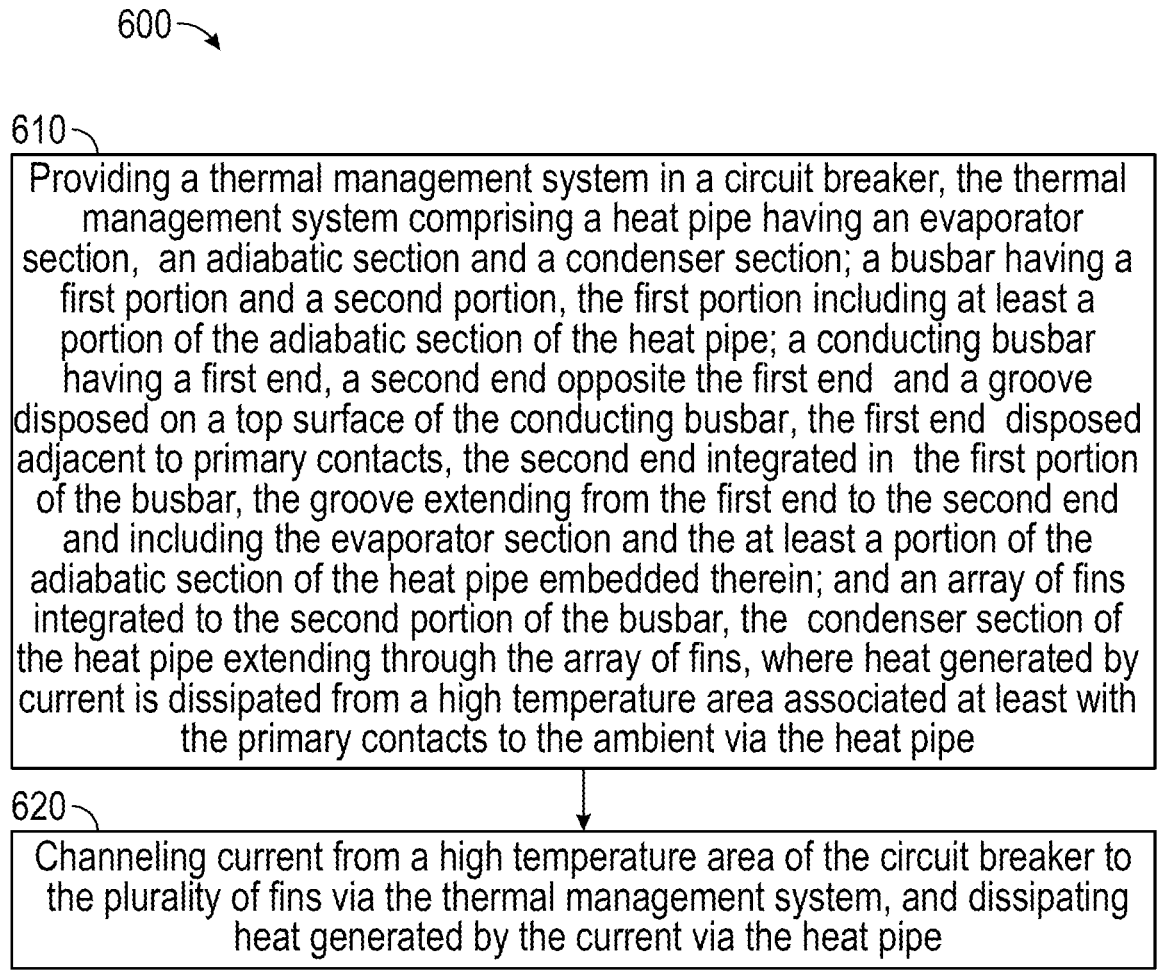
FIG. 6 is a flow chart of a method of thermal management of a circuit breaker in accordance with an example embodiment of the disclosed concept.

FIG. 6 is a flow chart of a method 600 of thermal management in a circuit breaker according to a non-limiting, example embodiment of the disclosed concept. The thermal management device 100 as described with reference to FIGS. 1-4 G may be used for the thermal management of the circuit breaker.

At 610, a thermal management device is provided in the circuit breaker. The thermal management device may include a heat pipe having an evaporator section, an adiabatic section and a condenser section. It also includes a busbar having a first portion and a second portion, the first portion including at least a portion of the adiabatic section of the heat pipe. The busbar may include a line busbar coupled to a primary stationary contact and a load busbar coupled to a primary moving arm. It also includes a conducting busbar having a first end, a second end opposite the first end and a groove disposed on a top surface of the conducting busbar, the first end disposed adjacent to primary contacts, the second end integrated in the first portion of the busbar, the groove extending from the first end to the second end and including the evaporator section and the at least a portion of the adiabatic section of the heat pipe embedded therein. It further includes an array of fins integrated to the second portion of the busbar, the condenser section of the heat pipe extending through the array of fins. The heat generated by current is dissipated from a high temperature area associated with the primary contacts to the ambient via the heat pipe.

At 620, current is channeled from a high temperature area of the circuit breaker to the array of fins via the thermal management device and heat generated by the current is dissipated via the heat pipe. That is, the current is carried from the conducting busbar to the busbars, and then to the plurality of fins, and heat caused by the current is dissipated via the heat pipe.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of disclosed concept which is to be given the full breadth of the claims appended and any and all equivalents thereof.

What is claimed is:

1. A thermal management device for a circuit breaker, comprising:
   a first heat pipe having an evaporator section, an adiabatic section and a condenser section;
   a busbar having a first portion and a second portion, the first portion including at least a portion of the adiabatic section of the heat pipe;
   a conducting busbar having a first end, a second end opposite the first end and a first groove disposed on a top surface of the conducting busbar, the first end disposed adjacent to primary contacts, the second end integrated in the first portion of the busbar, the first groove extending from the first end to the second end and including the evaporator section and the at least a portion of the adiabatic section of the first heat pipe embedded therein; and
   an array of fins integrated to the second portion of the busbar, the condenser section of the first heat pipe extending through the array of fins,
   wherein heat generated by current is dissipated from a high temperature area associated with the primary contacts to the ambient via at least the first heat pipe.

2. The thermal management device of claim 1, further comprising:
   a second heat pipe having a second evaporator section, a second adiabatic section and a second condenser section;
   a second busbar having a first portion and a second portion, the first portion including at least a portion of the adiabatic section of the second heat pipe;
   a second conducting busbar having a first end, a second end opposite the first end and a second groove on a top surface of the second conducting busbar, the first end disposed adjacent to a primary moving arm, the second end integrated in the first portion of the second busbar, the second groove extending from the first end to the second end and including the second evaporator section and the at least a portion of the second adiabatic section of the second heat pipe embedded therein; and
   a second array of fins integrated to the second portion of the second busbar, the second condenser section of the second heat pipe extending through the second array of fins,
   wherein the heat generated by the current is dissipated from the high temperature area associated at least with the primary contacts to the ambient via at least the second heat pipe.

3. The thermal management device of claim 2, wherein the busbar comprises line busbar structured to be coupled to a power source and the second busbar comprises a load busbar structured to be coupled to a load.

4. The thermal management device of claim 1, the current is channeled from the primary contacts to the conducting busbar, the busbar, and the plurality of fins.

5. The thermal management device of claim 1, further comprising a third heat pipe, wherein the conducting busbar further comprises a third groove disposed on a bottom surface of the conducting busbar, the evaporator section and the at least a portion of the adiabatic section of the third heat pipe are embedded within the third groove of the conducting busbar, the condenser section of the third heat pipe transits through the array of fins in parallel to and below the condenser section of the first heat pipe.

6. The thermal management device of claim 1, wherein the array of fins comprises at least two arrays of fins, wherein the first groove includes a first groove member expanding one half of the top surface of the conducting busbar and a second groove member expanding the other half of the top surface of the conducting busbar, the heat pipe includes a first member and a second member, the evaporator section and at least a portion of the adiabatic section of the first member of the first heat pipe are embedded in the first groove member, the evaporator section and at least a portion of the adiabatic section of the second member of the first heat pipe are embedded in the second groove member, the condenser section of the first member of the first heat pipe transits through one array of the at least two arrays of fins, and the condenser section of the second member of the first heat pipe transits through another array of the at least two arrays of fins.

7. The thermal management device of claim 6, wherein the at least two arrays of fins extend transversely along the second end of the conducting busbar and away from each other.

8. The thermal management device of claim 6, wherein the at least two arrays of fins extend laterally away from the first end of the conducting busbar and in parallel to each other with the busbar disposed therebetween.

9. The thermal management device of claim 1, wherein the thermal management device is disposed within the circuit breaker.

10. The thermal management device of claim 1, wherein the thermal management device is structured to be coupled to an electric connection to the load.

11. The thermal management device of claim 1, wherein the thermal management device uses a phase change as a medium to absorb heat at the evaporator section.

12. The thermal management device of claim 1, wherein the heat is cooled in the condenser section.

13. A circuit breaker structured to be coupled between a power source via a hot conductor and a load via a load conductor, comprising:
primary stationary contact coupled to the hot conductor and a primary moving contact coupled to the load conductor;
an operating mechanism structured to cause the primary contacts to close during normal operation and open to interrupt current from flowing to the load during a high current event; and
a thermal management device comprising:
a heat pipe having an evaporator section, an adiabatic section and a condenser section;
a busbar having a first portion and a second portion, the first portion including at least a portion of the adiabatic section of the heat pipe;
a conducting busbar having a first end, a second end opposite the first end and a groove disposed on a top surface of the conducting busbar, the first end disposed adjacent to primary contacts, the second end integrated in the first portion of the busbar, the groove extending from the first end to the second end and including the evaporator section and the at least a portion of the adiabatic section of the heat pipe embedded therein; and
an array of fins integrated to the second portion of the busbar, the condenser section of the heat pipe extending through the array of fins,
wherein heat generated by current is dissipated from a high temperature area associated with the primary contacts to the ambient via at least the heat pipe.

14. The circuit breaker of claim 13, wherein the thermal management device further comprises:
a second heat pipe having a second evaporator section, a second adiabatic section and a second condenser section;
a second busbar having a first portion and a second portion, the first portion including at least a portion of the second adiabatic section of the second heat pipe;
a second conducting busbar having a first end, a second end opposite the first end and a second groove on a top surface of the second conducting busbar, the first end disposed adjacent to a primary moving arm, the second end integrated in the first portion of the busbar, the second groove extending from the first end to the second end and including the second evaporator section and the at least a portion of the second adiabatic section of the second heat pipe embedded therein; and
a second array of fins integrated to the second portion of the second busbar, the second condenser section of the second heat pipe extending through the second array of fins,
wherein the heat generated by the current is dissipated from the high temperature area associated at least with the primary contacts to the ambient via the second heat pipe.

15. The circuit breaker of claim 14, wherein the busbar comprises line busbar structured to be coupled to the hot conductor and the second busbar comprises a load busbar structured to be coupled to the load conductor.

16. The circuit breaker of claim 13, wherein the heat pipe comprises at least two heat pipes, the conducting busbar further comprises another groove disposed on a bottom surface of the conducting busbar, and the array of fins comprises at least two arrays of fins, one array coupled to one edge of the second portion of the busbar and another array coupled to another edge opposite the one edge of the second portion of the busbar.

17. The circuit breaker of claim 16, wherein the evaporator section and the at least a portion of the adiabatic section of one of the at least two heat pipes are embedded within the groove on the top surface of the conducting busbar, and the evaporator section and the at least a portion of the adiabatic section of another one of the at least two heat pipes are embedded within the another groove on the bottom surface of the conducting busbar, the at least the two heat pipes running from the first end of the conducting busbar through the at least the two arrays of fins.

18. The circuit breaker of claim 16, wherein the at least two arrays of fins extend transversely away from each other and remaining portions of the adiabatic sections are embedded in a groove on a surface of the second portion of the busbar.

19. The circuit breaker of claim 16, wherein the at least two arrays of fins extend laterally away from the first end of the conducting busbar and in parallel to each other with the busbar disposed therebetween.

20. A method of thermal management for a circuit breaker structured to be connected between a power source and a load, the method comprising:

provide a thermal management device in a circuit breaker, the thermal management device comprising: (a) a heat pipe having an evaporator section, an adiabatic section and a condenser section; (b) a busbar having a first portion and a second portion, the first portion including at least a portion of the adiabatic section of the heat pipe; (c) a conducting busbar having a first end, a second end opposite the first end and a groove disposed on a top surface of the conducting busbar, the first end disposed adjacent to primary contacts, the second end integrated in the first portion of the busbar, the groove extending from the first end to the second end and including the evaporator section and the at least a portion of the adiabatic section of the heat pipe embedded therein; and (d) an array of fins integrated to the second portion of the busbar, the condenser section of the heat pipe extending through the array of fins; and channeling current from a high temperature area of the circuit breaker to the array of fins via the thermal management device, and dissipating heat generated by the current via the heat pipe.

* * * * *